(12) United States Patent
Mathew et al.

(10) Patent No.: US 7,611,936 B2
(45) Date of Patent: Nov. 3, 2009

(54) METHOD TO CONTROL UNIFORMITY/COMPOSITION OF METAL ELECTRODES, SILICIDES ON TOPOGRAPHY AND DEVICES USING THIS METHOD

(75) Inventors: Leo Mathew, Austin, TX (US); Ross E. Noble, Austin, TX (US); Raghaw S. Rai, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 377 days.

(21) Appl. No.: 11/803,097

(22) Filed: May 11, 2007

(65) Prior Publication Data

US 2008/0280429 A1   Nov. 13, 2008

(51) Int. Cl.
*H01L 21/336* (2006.01)
(52) U.S. Cl. .................. 438/197; 438/212; 438/299; 257/E21.19
(58) Field of Classification Search .............. 438/197, 438/199, 206, 212, 229, 299, 300, 301; 257/E21.19
See application file for complete search history.

(56) References Cited

U.S. PATENT DOCUMENTS 5,844,278 A * 12/1998 Mizuno et al. ............. 257/345
7,074,662 B2 * 7/2006 Lee et al. .................. 438/199
7,119,384 B2 * 10/2006 Popp et al. ................. 257/250
7,268,396 B2 * 9/2007 Lee et al. .................. 257/347
7,427,549 B2 * 9/2008 Mathew et al. ............ 438/300
7,479,429 B2 * 1/2009 Rao et al. .................. 438/261
2006/0177998 A1   8/2006 Lin et al.

OTHER PUBLICATIONS

Mathew, L. et al.; Double gate CMOS technology with sub-lithographic (<20nm), 100nm tall, Undoped channel, TiN+ HfxZr1-xO2 gate, Multiple Silicided Source/Drain with Record PMOS Ion/Ioff; University of Florida; Jan. 11, 2007; 2 pages.

* cited by examiner

*Primary Examiner*—Kevin M Picardat
(74) *Attorney, Agent, or Firm*—John A. Fortkort; Fortkort & Houston P.C.

(57) ABSTRACT

A method for depositing metals on surfaces is provided which comprises (a) providing a substrate (103) having a horizontal surface (107) and a vertical surface (105); (b) depositing a first metal layer (109) over the horizontal and vertical surfaces; (c) depositing a layer of polysilicon (111) over the horizontal and vertical surfaces; (d) treating the layer of polysilicon with a plasma such that a residue (113) remaining from the treatment is preferentially formed over the horizontal surfaces rather than the vertical surfaces, and wherein the residue is resistant to a first metal etch; and (e) exposing the substrate to the first metal etch.

20 Claims, 11 Drawing Sheets

METHOD TO CONTROL UNIFORMITY/COMPOSITION OF METAL ELECTRODES, SILICIDES ON TOPOGRAPHY AND DEVICES USING THIS METHOD

FIELD OF THE DISCLOSURE

The present disclosure relates generally to semiconductor manufacturing, and more particularly to methods for using etch residues as masking agents in semiconductor fabrication processes.

BACKGROUND OF THE DISCLOSURE

The formation of residues attendant to etching is a problem which is well known in the semiconductor fabrication arts. Plasma processes prone to residue formation include polysilicon etches, metal etches, tungsten plug etch-backs, contact etches and via etches. Such residues, which are frequently polymeric and organometallic in nature, are known to increase resistance and to reduce device speed. Hence, the removal of these residues through a suitable cleaning process is a standard part of many commercial semiconductor fabrication processes.

Several cleaning processes have been developed in the art for the removal of such residues. These cleaning processes rely on a variety of organic solvents or aqueous based chemistries. For example, the use of cleaning chemistries based on dilute hydrofluoric acid or hydroxylamines are both well known in the art for the removal of etch residues.

DETAILED DESCRIPTION

In one aspect, a method for depositing metals on surfaces is provided which comprises (a) providing a substrate having a horizontal surface and a vertical surface; (b) depositing a first metal layer over the horizontal and vertical surfaces; (c) depositing a layer of polysilicon over the first metal layer; (d) treating the layer of polysilicon with a plasma such that a residue remaining from the treatment is preferentially formed over the horizontal surfaces rather than the vertical surfaces, and wherein the residue is resistant to a first metal etch; and (e) exposing the substrate to the first metal etch.

In another aspect, a method for making a CMOS device is provided which comprises (a) providing a semiconductor structure having NMOS and PMOS regions defined therein, wherein each of the NMOS and PMOS regions has at least one vertical and horizontal surface associated therewith; (b) depositing a first metal layer comprising a first metal over the horizontal and vertical surfaces of the PMOS region; (c) forming an etch residue on the horizontal surface of the PMOS region; and (d) selectively removing the first metal from the vertical surface in the PMOS region such that the first metal remains on the horizontal surface in the PMOS region.

It has now been found that the formation of etch residues, which have previously been considered undesirable in the art, may be utilized as effective masking agents in semiconductor fabrication processes. In particular, it has been found that such residues form predominantly on the horizontal surfaces of semiconductor structures. Since these residues passivate the underlying surface from certain types of etches and other semiconductor processes, they may be utilized as a tool to achieve different surface treatments for horizontal and vertical surfaces in a semiconductor structure.

As a specific example, this approach may be utilized to separately metallize the vertical and horizontal semiconductor surfaces of a semiconductor device so as to achieve different metal thicknesses, or different metal compositions, on those surfaces. This may be accomplished, for example, by depositing a first metal on the horizontal and vertical surfaces, using an etching process to form a residue on the horizontal surfaces, and selectively removing at least a portion of the metal from the exposed vertical surfaces through the use of an etch to which the residue is resistant. In some cases, the structure may then be subjected to a second metallization with a second metal which is the same as, or different from, the first metal. This second metallization may occur before or after the residue is stripped from the horizontal surfaces, and in some embodiments may be followed by an anisotropic metal etch.

It will be appreciated that the aforementioned process may be used to make a variety of advantageous structures. For example, this approach may be used to produce FinFET structures having different metallizations on different surfaces thereof, which may be beneficial, for example, in dealing with parasitic capacitances or improving carrier mobility. This approach may also be used to deposit different metals on N and P contacts, or to modulate the work function of gate electrodes.

Figure 1:
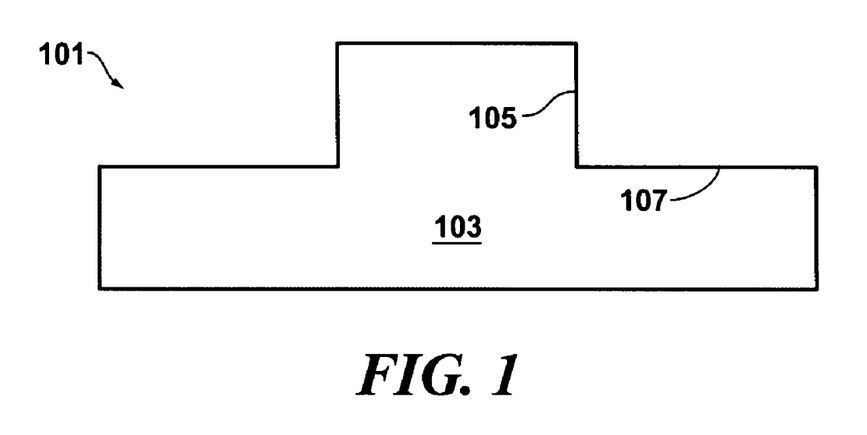
FIG. 1 is a cross-sectional view illustrating a step in a first embodiment of a process in accordance with the teachings herein.

FIGS. 1-6 depict a first particular, non-limiting embodiment of a process in accordance with the teachings herein. As shown in FIG. 1, a structure 101 is provided which comprises a substrate 103 having vertical 105 and horizontal 107 surfaces. Since this method has wide applicability, the substrate 103 is depicted simply as a generic structure having vertical 105 and horizontal 107 surfaces. However, it will be appreciated that, in a particular application, the structure 101 may have various other features which are not depicted here. Thus, for example, the structure 101 may be a CMOS device having a gate structure which is disposed on a substrate equipped with spacer structures and source and drain regions.

Figure 2:
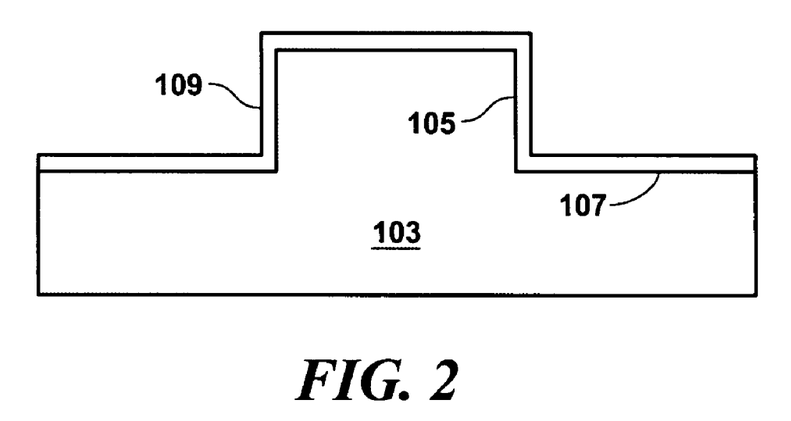
FIG. 2 is a cross-sectional view illustrating a step in a first embodiment of a process in accordance with the teachings herein.

As shown in FIG. 2, a first metal layer 109 is disposed over the substrate 103. The first metal layer may be formed through a variety of processes as are known to the art, including chemical vapor deposition (CVD), plasma enhanced chemical vapor deposition (PECVD), electroplating, or through electroless processes. Various metals or metal alloys may be used in the first metal layer, including, but not limited to, Cu, Ni, Co, W, Ti, TiW, and CoW.

Figure 3:
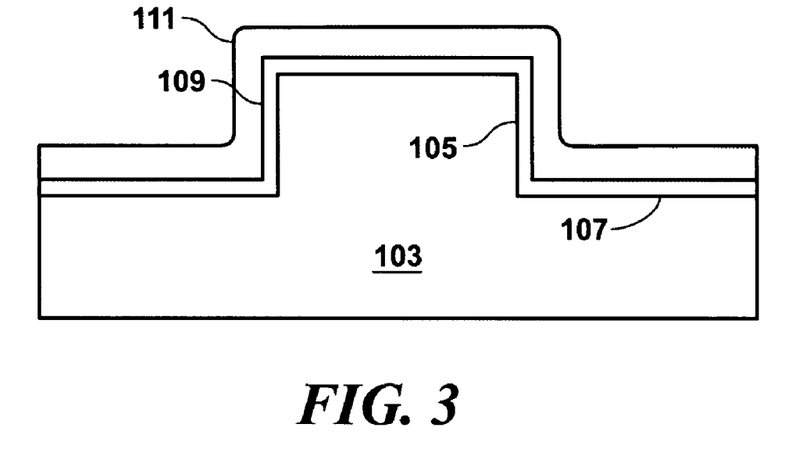
FIG. 3 is a cross-sectional view illustrating a step in a first embodiment of a process in accordance with the teachings herein.
Figure 4:
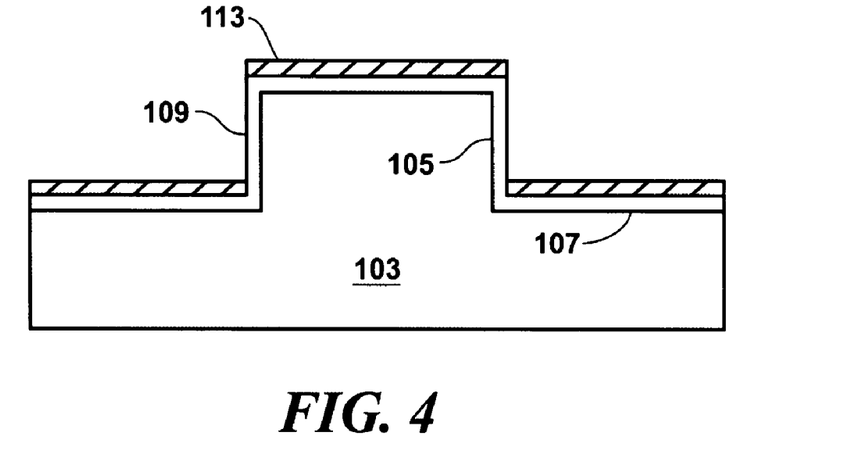
FIG. 4 is a cross-sectional view illustrating a step in a first embodiment of a process in accordance with the teachings herein.

As seen in FIG. 3, a conformal layer of polysilicon 111 is then disposed over the substrate 103. The layer of polysilicon 111 is then etched back, preferably with a dry anisotropic etch, thus leaving a layer of residue 113 disposed over the horizontal portions of the first metal layer 109 as shown in FIG. 4. The dry etch preferably comprises a halogen-containing material and a reducing gas, and is applied at ambient temperatures. The halogen-containing materials which may be used in this process are preferably selected from the group consisting of $Cl_2$, $Br_2$, and HBr, but may also comprise, without limitation, HF, $SiF_4$, HCl, $BCl_3$, $SiCl_4$, $CF_2Cl_2$, $CFCl_3$, $CHCl_3$, $CCl_4$, and $CF_3Br$, or various combinations of the foregoing. The reducing gas is preferably carbon monoxide, but may also comprise, without limitation, $NO_x$, $CH_4$, and $O_3$, or various combinations of the foregoing. Without wishing to be bound by theory, it is believed that combinations of the elements from the reducing gas, the halogen-containing material, and/or the etched materials form the layer of residue 113, and that the power of the plasma and the selection of the reducing gas and/or halogen-containing material determines the thickness of this layer and the rate at which it is formed.

Figure 5:
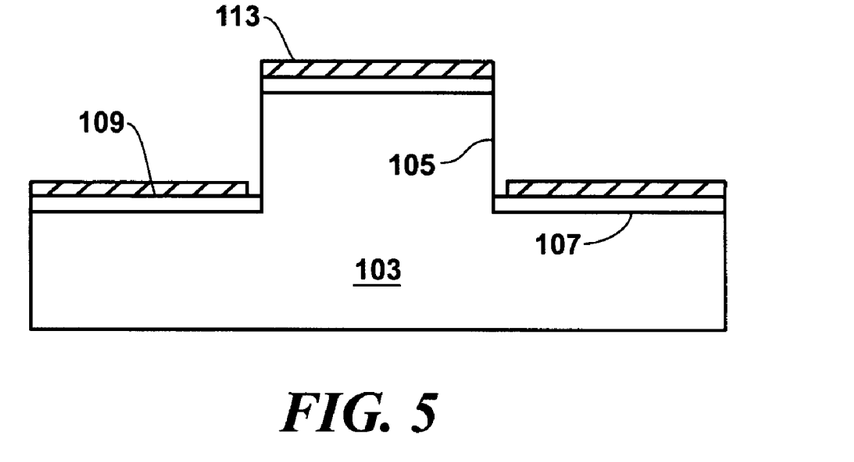
FIG. 5 is a cross-sectional view illustrating a step in a first embodiment of a process in accordance with the teachings herein.

As shown in FIG. 5, the structure is then subjected to a metal etch. The layer of residue 113 may be essentially impervious to this etch, or may simply cause the portion of the first metal layer 109 overlying the horizontal surface to etch at a rate $R_h$ which is slower than the rate $R_v$ at which the portion of the first metal layer 109 overlying the vertical surface etches. The etch may be an aqueous etch or a plasma etch. The chemistry of the etch will typically depend on the composition of the first metal layer, but may be, for example, anisotropic aqueous HCl etch or a plasma etch based on $Cl_2/BCl_3$ or HCl plasmas. As a result of the etch, the portions of the first metal layer 109 disposed over the vertical surfaces 105 of the substrate are removed by the etch, while the portions of the first metal layer 109 disposed over the horizontal surfaces 107 of the substrate remain.

Figure 6:
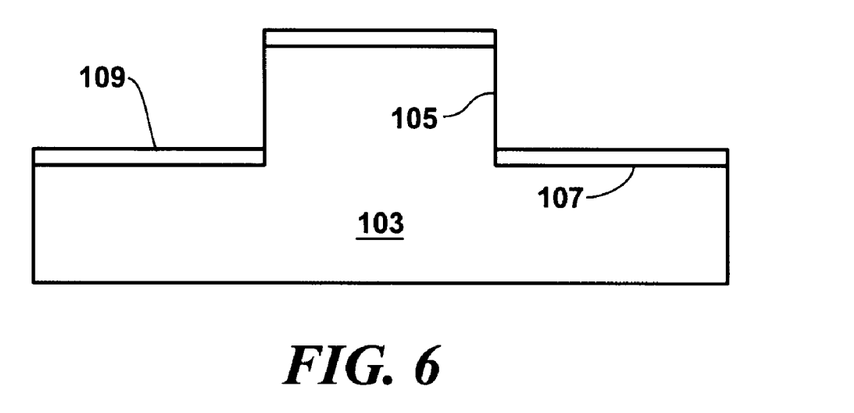
FIG. 6 is a cross-sectional view illustrating a step in a first embodiment of a process in accordance with the teachings herein.

As shown in FIG. 6, the layer of residue 113 is then stripped using any of the various methods and chemistries as are known to the art. These include, for example, treatment with dilute aqueous HF, or treatment with hydroxylamines. In the resulting structure, the first metal layer 109 is disposed only over the horizontal surfaces of the structure.

Figure 7:
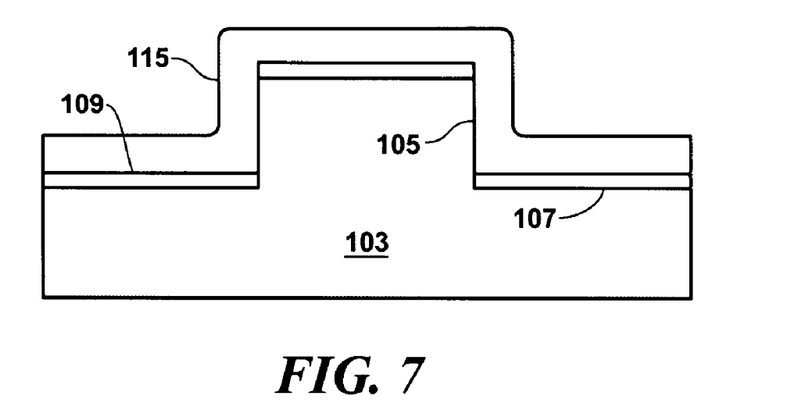
FIG. 7 is a cross-sectional view illustrating a step in a second embodiment of a process in accordance with the teachings herein.

FIG. 7 illustrates a second particular, non-limiting embodiment of a process in accordance with the teachings herein. This process is similar to the first embodiment except that, after the structure depicted in FIG. 6 is achieved, a second metal layer 115 is formed over the structure. This second metal layer 115 may be formed by a process which is the same as, or different from, the process used to form the first metal layer 107. Moreover, the second metal layer 115 may comprise any of the metals which may be used in the first metal layer 109, and may have a composition which is the same as, or different from, the first metal layer 109. If the structure is a CMOS device, the first and second metals may be complementary, and thus may be chosen to optimize the work functions of the gate electrodes in the PMOS and NMOS regions of the device. For example, one of the first and second metals may be platinum, and the other metal may be erbium.

Figure 8:
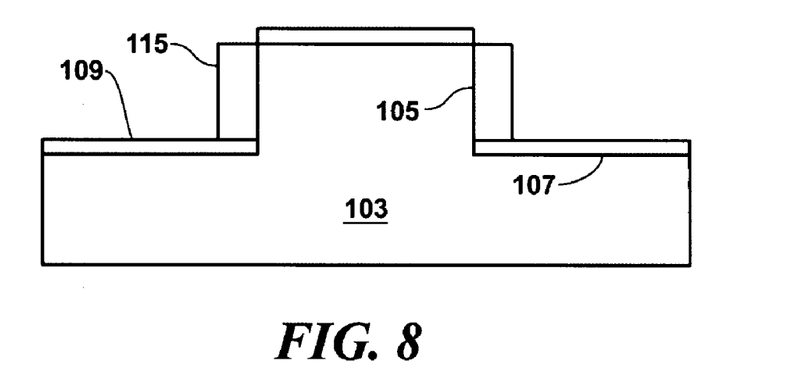
FIG. 8 is a cross-sectional view illustrating a step in a third embodiment of a process in accordance with the teachings herein.

FIG. 8 illustrates a third particular, non-limiting embodiment of a process in accordance with the teachings herein. This process is similar to the second embodiment except that, after the structure depicted in FIG. 7 is achieved, the second metal layer 115 is subjected to an anisotropic etch. Hence, the horizontal surfaces 105 of the structure have a first metal layer 109 disposed thereon which may have a first composition and a first thickness, and the vertical surfaces 105 of the structure have a second metal layer 115 disposed thereon which may have a second composition and a second thickness. The first and second compositions, and the first and second thicknesses, may be the same or different.

Figure 9:
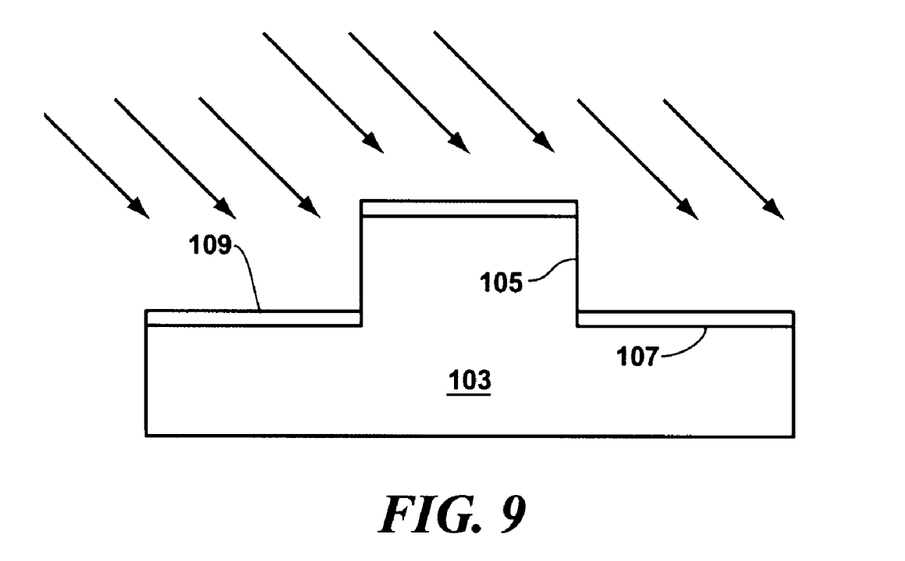
FIG. 9 is a cross-sectional view illustrating a step in a fourth embodiment of a process in accordance with the teachings herein.

FIG. 9 illustrates a fourth particular, non-limiting embodiment of a process in accordance with the teachings herein. This process is similar to the first embodiment except that, after the structure depicted in FIG. 6 is achieved, the structure is subjected to one or more implant steps. During the implant process, the first metal layer 109 acts as an implant mask such that implantation only occurs in the vertical surfaces of the substrate.

The implant steps are preferably angled implant steps and, in embodiments having multiple implant steps, these implants steps may occur at the same or different angles. Thus, in one exemplary embodiment, a first angled implant may be conducted at a first angle $\phi_1$ (as measured in a counterclockwise direction from an axis which is normal to the substrate), and at a second angled implant may be conducted at a second angle $-\phi_2$, where $|\phi_1|$ and $|\phi_2|$ may be the same or different. Preferably, $|\phi_1|$ and $|\phi_2|$ are within the range of about 20° to about 70°, more preferably, $|\phi_1|$ and $|\phi_2|$ are within the range of about 30° to about 60°, and most preferably, $|\phi_1|$ and $|\phi_2|$ are within the range of about 40° to about 50°.

Figure 10:
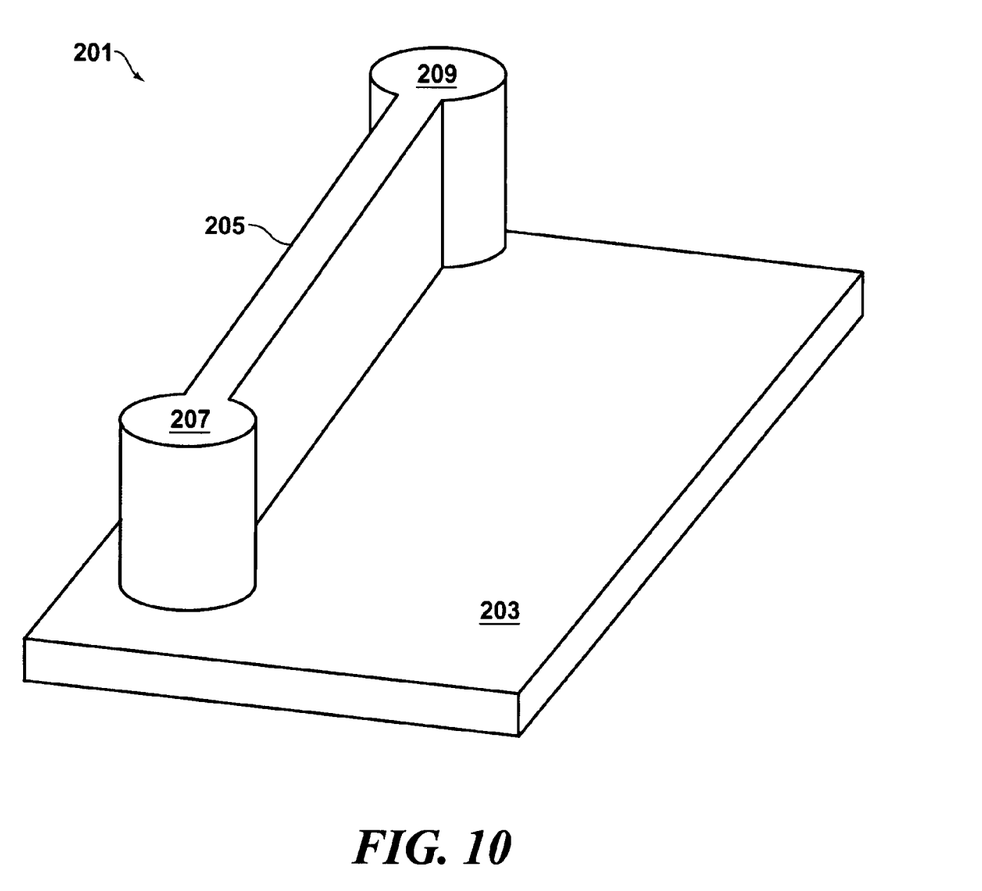
FIG. 10 is a perspective view illustrating a step in a fifth embodiment of a process in accordance with the teachings herein.

FIGS. 10-17 depict a particular, non-limiting embodiment of the application of the teachings herein to the fabrication of a FinFET structure having different metallizations on the horizontal and vertical surfaces thereof. With reference to FIG. 10, a semiconductor structure 201 is provided which comprises a dielectric substrate 203 having a fin 205 disposed thereon. The fin 205 extends between source 207 and drain 209 regions (which may be further defined in subsequent process steps) and, upon completion of the FinFET, will contain the channel region of the transistor.

The semiconductor structure 201 of FIG. 10 may be formed from a semiconductor-on-insulator (SOI) wafer or other suitable substrate. Processes for forming such structures are well known in the art and typically include use of suitable masking and etching processes.

Figure 11:
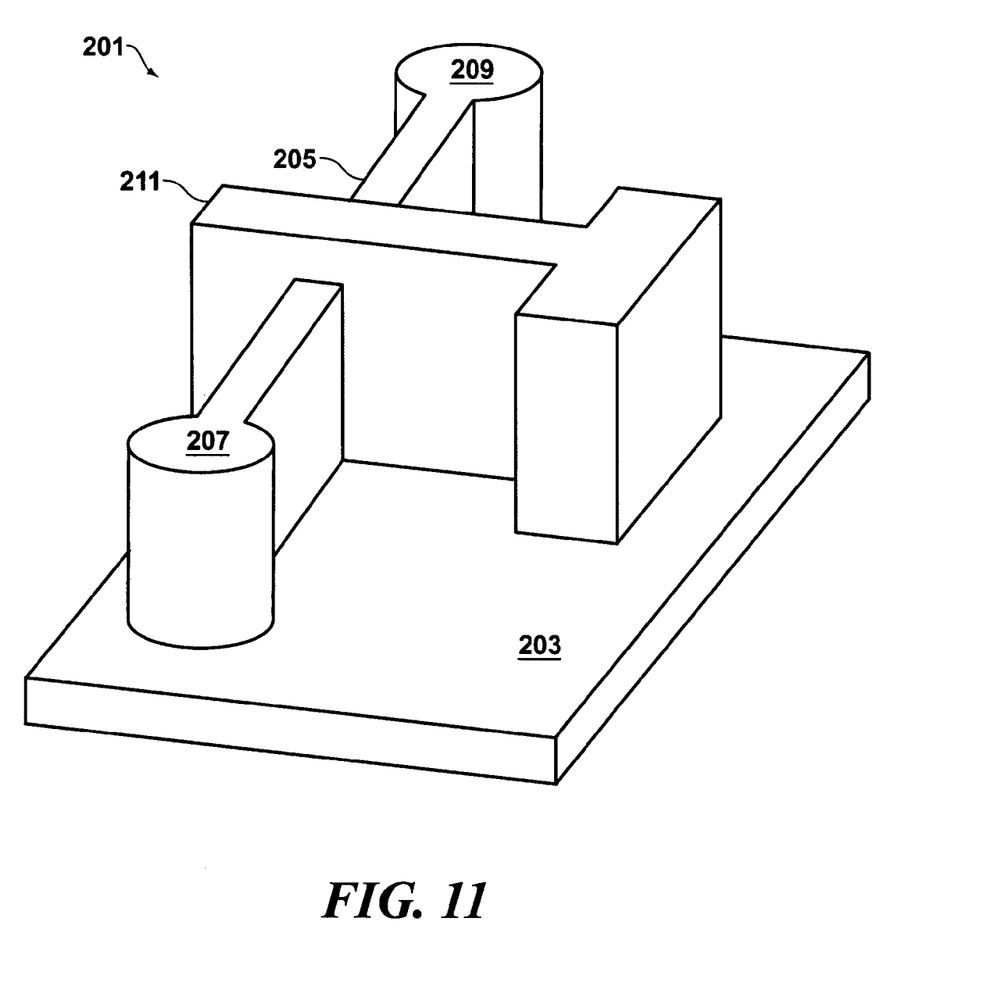
FIG. 11 is a perspective view illustrating a step in a fifth embodiment of a process in accordance with the teachings herein.

With reference to FIG. 11, following formation of the fin 205, a gate structure 211 is formed which extends over the fin 205. The gate structure may be formed, for example, by depositing a layer of polysilicon, and patterning the layer of polysilicon with suitable masking and etching processes. Though not shown, a layer of a suitable dielectric material is typically deposited over the fin 205 prior to formation of the gate structure 211, and the exposed portions of the layer of dielectric material are stripped after formation of the gate structure 211. As a result, an insulating layer of dielectric material remains between the gate structure 211 and the fin 205 to provide suitable electrical isolation between them.

Figure 12:
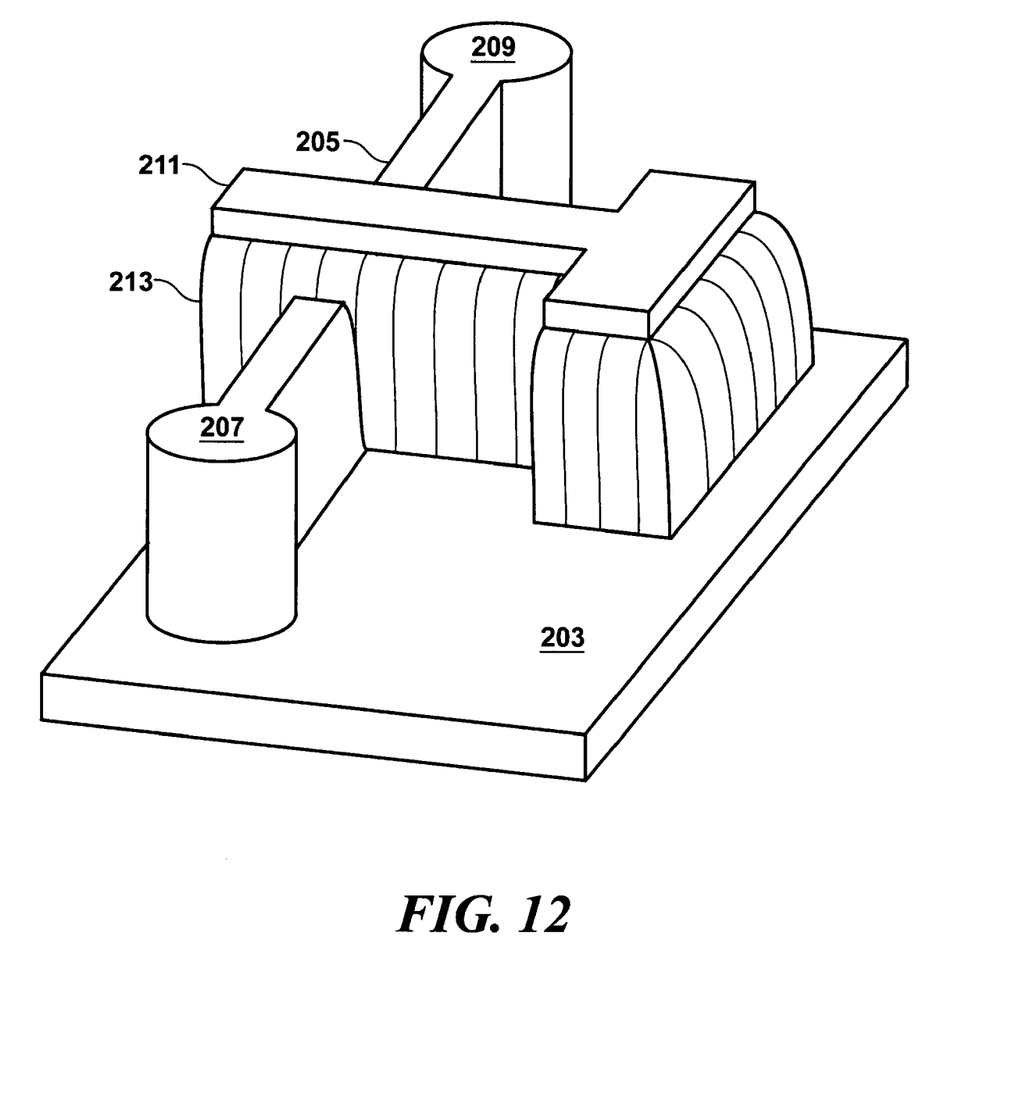
FIG. 12 is a perspective view illustrating a step in a fifth embodiment of a process in accordance with the teachings herein.

As shown in FIG. 12, a conformal layer, which may comprise, for example, an oxide or silicon nitride, is deposited over the structure. The conformal layer is then subjected to a suitable etch back, preferably with a dry, anisotropic etch, to produce spacer structures 213 on the primary faces of the fin 205. One or more implant steps may be utilized at this point in the process to define the source and drain regions of the device, and/or to modify the doping profile of the channel region.

Figure 13:
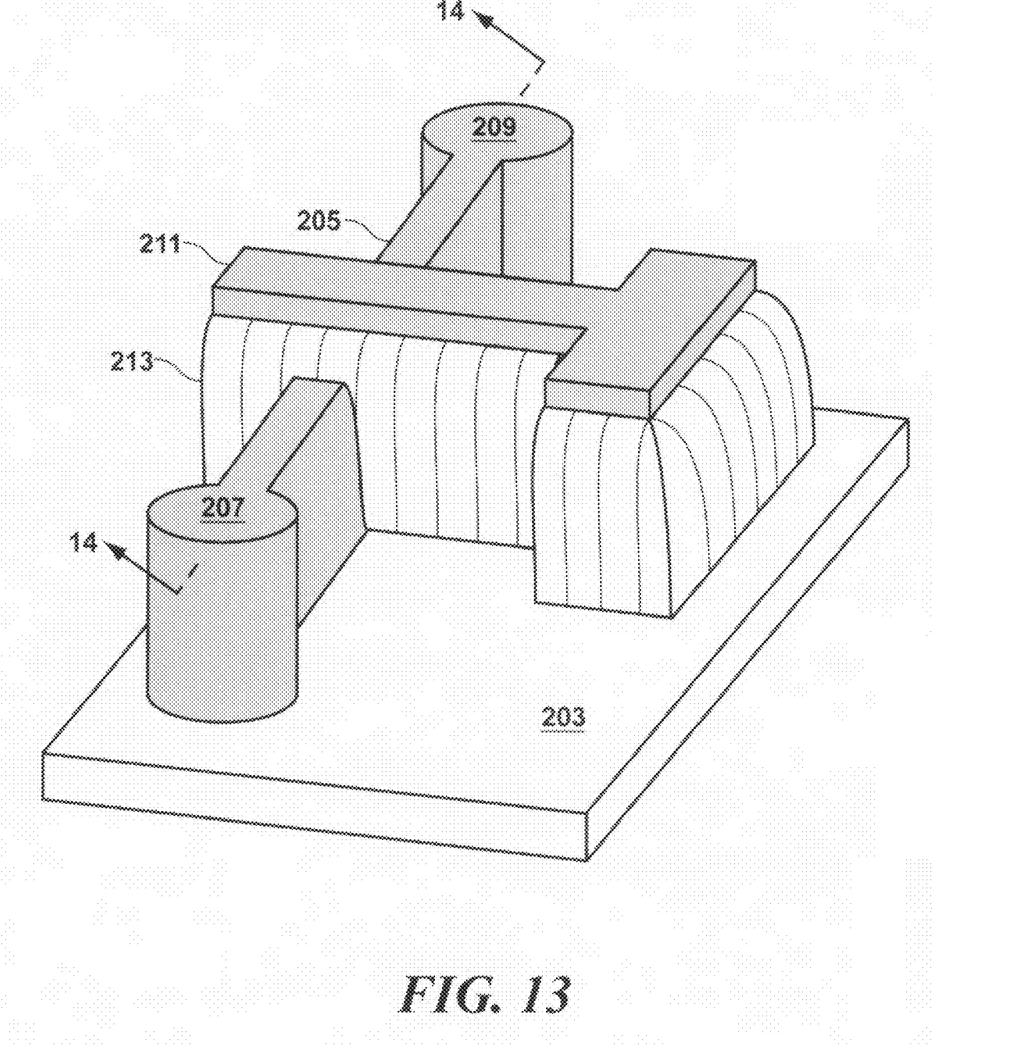
FIG. 13 is a perspective view illustrating a step in a fifth embodiment of a process in accordance with the teachings herein.
Figure 14:
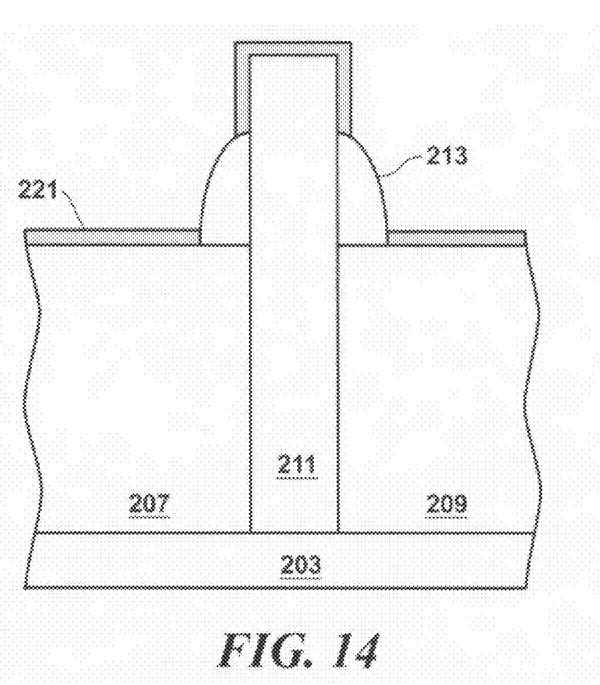
FIG. 14 is a cross-sectional illustration taken along LINE 14-14 of FIG. 13.
Figure 15:
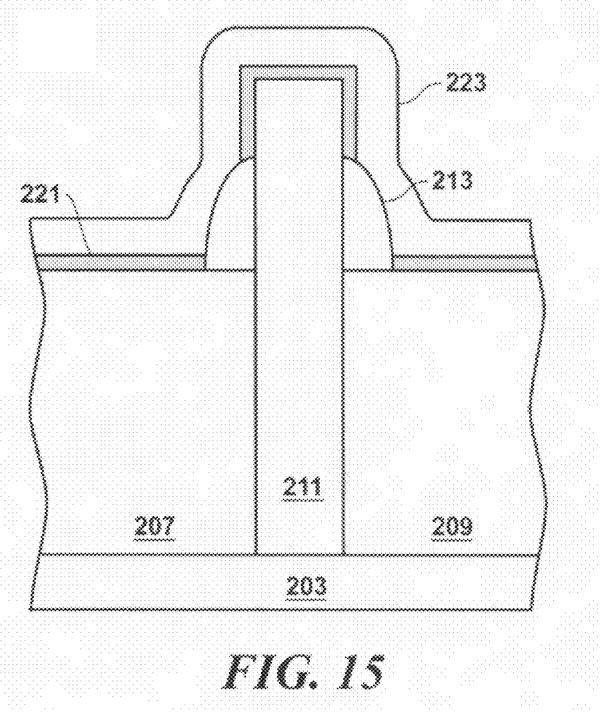
FIG. 15 is a cross-sectional view illustrating a step in a fifth embodiment of a process in accordance with the teachings herein.
Figure 16:
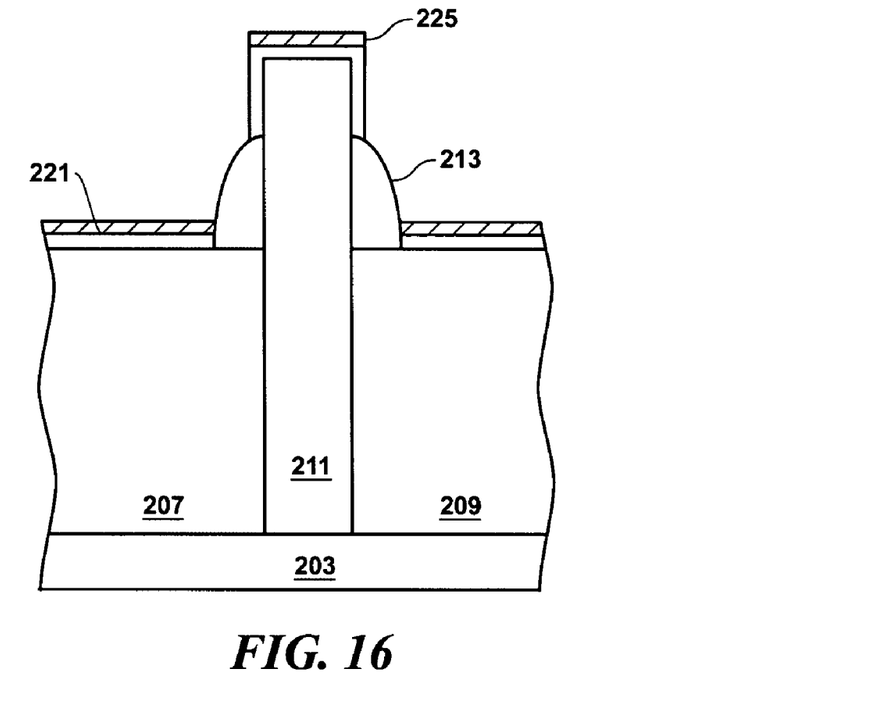
FIG. 16 is a cross-sectional view illustrating a step in a fifth embodiment of a process in accordance with the teachings herein.
Figure 17:
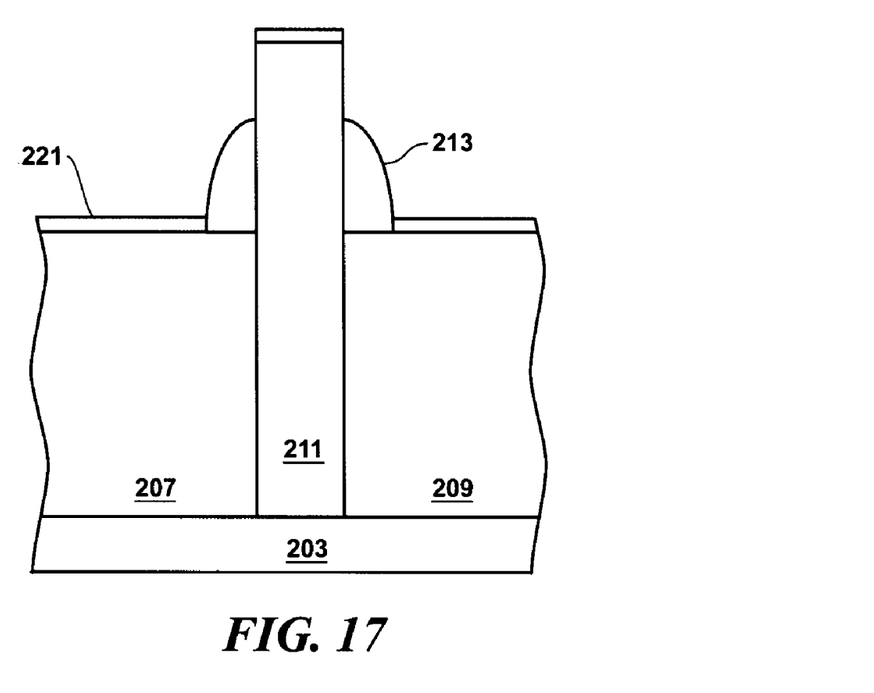
FIG. 17 is a cross-sectional view illustrating a step in a fifth embodiment of a process in accordance with the teachings herein.

Referring now to FIG. 13 and the cross-sectional view thereof shown in FIG. 14, a layer of a first metal 221 is formed over the structure. As shown in FIG. 15, a layer of polysilicon 223 is then deposited over the structure, and is anisotropically etched back to form a layer of residue 225 on the horizontal surfaces of the structure as shown in FIG. 16. As shown in FIG. 17, the exposed portions of the first metal layer 221 are then removed with an etch to which the layer of residue 225 is impervious, after which the layer of residue 225 is chemically stripped.

Figure 18:
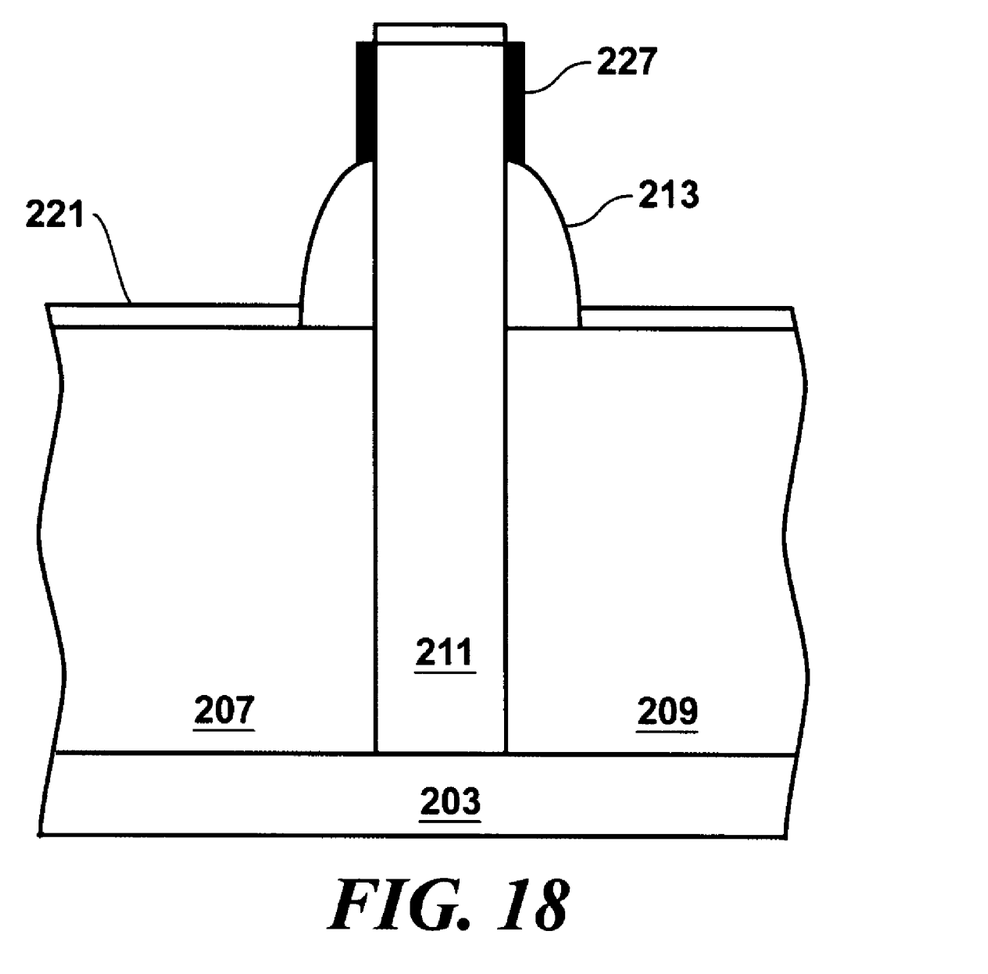
FIG. 18 is a cross-sectional view illustrating a step in a fifth embodiment of a process in accordance with the teachings herein.
Figure 19:
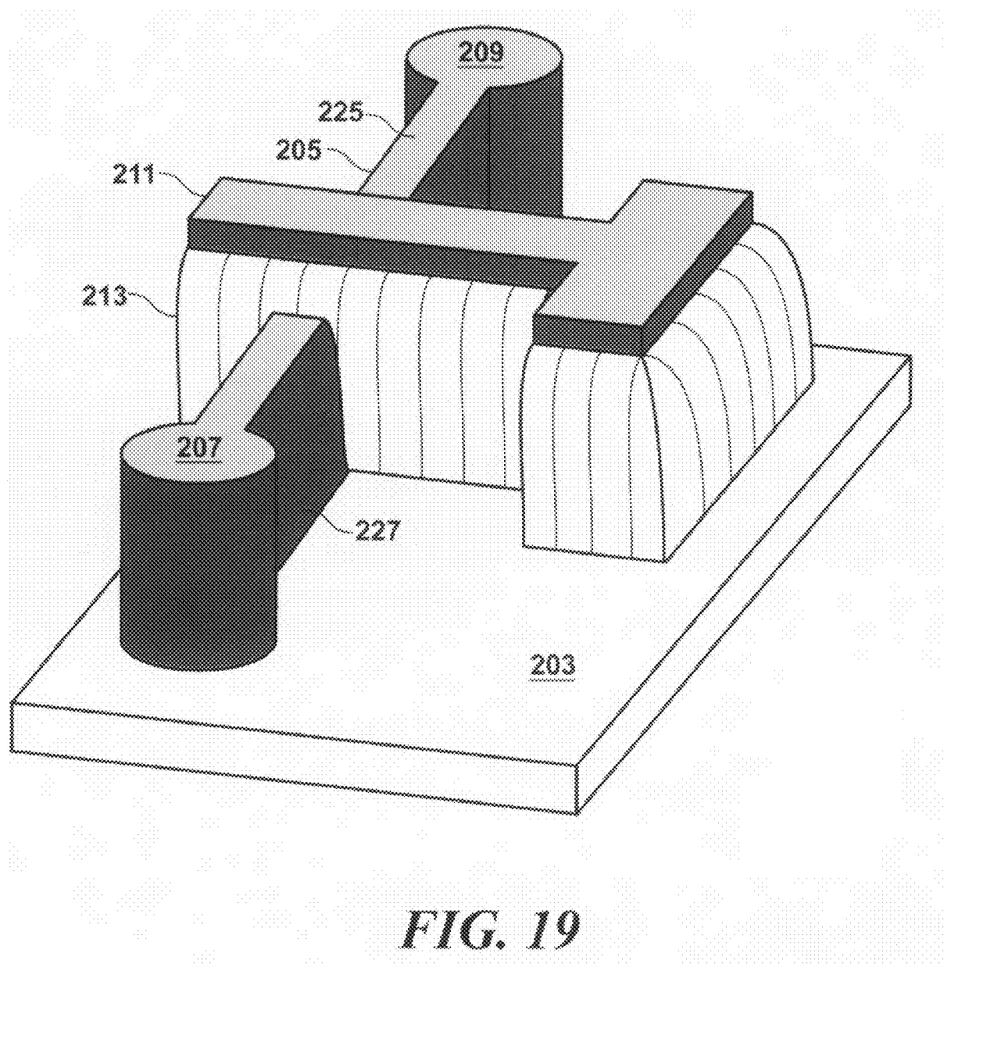
FIG. 19 is a perspective view illustrating a step in a fifth embodiment of a process in accordance with the teachings herein.

Referring now to FIGS. 18 and 19, a second metal layer 227, which may be the same as or different from the first metal layer 221, is then deposited over the structure such that the vertical surfaces of the structure are covered by the second metal layer 227. This may be accomplished, for example, by depositing the second metal layer 227 over the structure, which may or may not be followed by a suitable anisotropic metal etch. Various other processing steps as are known to the art may follow, including salicidation of either or both of the first 221 and second 227 metal layers.

The foregoing process has a number of useful advantages. First of all, because it allows metal layers of different compositions and thicknesses to be formed over the horizontal and vertical surfaces of the structure, these parameters may be utilized to help optimize the stress, and hence carrier mobility, in the fin 205.

These parameters may also be used to control the rate and extent of salicidation, and hence the amount of semiconductor material which is consumed in the salicidation process at each surface. For example, because of the aspect ratios involved, there is typically a greater amount of semiconductor material which may be lost to salicidation on the horizontal surface of a fin as opposed to the vertical surface without adversely affecting the properties of the device. Hence, the processes disclosed herein may be used to form a relatively thin layer of metal over the vertical surfaces of a fin (where the amount of semiconductor material which can be lost to salicidation without adverse effects is typically at a minimum), and to form a somewhat thicker layer of metal over the horizontal surfaces (where the amount of semiconductor material which can be lost to salicidation without adverse effects is typically at a maximum, and where a greater thickness of the resulting salicide layer may be desirable).

Moreover, through the use of appropriate masking steps, the methodologies disclosed herein may be applied individually to the NMOS and PMOS regions of a CMOS device. Consequently, metal layer compositions and thicknesses may be chosen separately for each of the vertical and horizontal surfaces in these regions of the device to optimize the characteristics of the resulting CMOS device. These characteristics may include, but are not limited to, the work functions of the gate electrodes in each of these regions.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

The terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the methodologies and devices described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a semiconductor device, comprising:
   providing a substrate having a horizontal surface and a vertical surface;
   depositing a first metal layer over the horizontal and vertical surfaces;
   depositing a layer of polysilicon over the first metal layer;
   treating the layer of polysilicon with a plasma such that a residue remaining from the treatment is preferentially formed over the horizontal surfaces rather than the vertical surfaces, and wherein the residue is resistant to a first metal etch; and
   subjecting the exposed portions of the first metal layer to a first metal etch.

2. The method of claim 1, wherein the first metal etch removes the first metal layer from the vertical surface at a rate $R_v$, wherein the first metal etch removes the first metal layer from the horizontal surface at a rate $R_h$, and wherein $R_v > R_h$.

3. The method of claim 1, wherein the vertical and horizontal surfaces form portions of the source or drain regions of a MOSFET.

4. The method of claim 1, further comprising;
   forming a second metal layer on the vertical and horizontal surfaces.

5. The method of claim 4, wherein the second metal layer is removed from the horizontal surface and remains on the vertical surface.

6. The method of claim 4, wherein the first and second metal layers are formed from first and second distinct metals.

7. The method of claim 4, wherein the first and second metal layers have substantially different thicknesses.

8. The method of claim 4, wherein the semiconductor device is a FinFET, and wherein the horizontal and vertical surfaces are disposed on a fin within said FinFET.

9. The method of claim 8, further comprising:
   subjecting the first and second metal layers to salicidation.

10. The method of claim 9, wherein the second metal layer has an average thickness which is substantially less than the average thickness of the first metal layer.

11. The method of claim 1, wherein the substrate comprises a first region selected from the group consisting of source and drain regions, and wherein said first region comprises the horizontal and vertical surfaces.

12. The method of claim 1, wherein the semiconductor device is a PMOS device, wherein the source region of the PMOS contains a portion of the vertical surface, and wherein the drain region of the PMOS also contains a portion of the vertical surface.

13. The method of claim 1, further comprising:
   partially etching the portion of the first metal layer which extends over the vertical surface; and
   removing the reside from the portion of the first metal layer which extends over the horizontal surface.

14. The method of claim 13, wherein the semiconductor device is a FinFET, and wherein the horizontal and vertical surfaces are disposed on a fin within said FinFET.

15. The method of claim 1, wherein the first metal etch removes the portion of the first metal layer from the vertical surface, and further comprising:
   subjecting the vertical surface to ion implantation.

16. The method of claim 15, wherein the first metal layer effectively masks the horizontal surface from ion implantation.

17. A method for making a CMOS device, comprising:
   providing a semiconductor structure having NMOS and PMOS regions defined therein, wherein each of the NMOS and PMOS regions has at least one vertical and horizontal surface associated therewith;
   depositing a first metal layer comprising a first metal over the horizontal and vertical surfaces of the PMOS region;
   forming an etch residue on the horizontal surface of the PMOS region; and
   selectively removing the first metal from the vertical surface in the PMOS region such that the first metal remains on the horizontal surface in the PMOS region.

18. The method of claim 17, further comprising:
   depositing a second metal layer comprising a second metal on the vertical surface in the NMOS region.

19. The method of claim 17, wherein the first and second metals are distinct.

20. The method of claim 19, wherein the average thicknesses of the first and second metal layers are substantially different.

* * * * *